(12) United States Patent
Arita et al.

(10) Patent No.: US 7,341,937 B2
(45) Date of Patent: Mar. 11, 2008

(54) SEMICONDUCTOR DEVICE AND METHOD OF MANUFACTURING SAME

(75) Inventors: Koji Arita, Kanagawa (JP); Masayoshi Tagami, Kanagawa (JP); Hidenobu Miyamoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 287 days.

(21) Appl. No.: 11/174,595

(22) Filed: Jul. 6, 2005

(65) Prior Publication Data

US 2005/0245075 A1    Nov. 3, 2005

Related U.S. Application Data

(62) Division of application No. 10/642,279, filed on Aug. 18, 2003, now Pat. No. 6,927,495.

(51) Int. Cl.
*H01L 21/4763* (2006.01)

(52) U.S. Cl. ...................... 438/626; 438/624; 438/625; 438/634

(58) Field of Classification Search ................ 438/624, 438/625, 626, 634
See application file for complete search history.

(56) References Cited

U.S. PATENT DOCUMENTS 4,888,632 A    12/1989    Haller

FOREIGN PATENT DOCUMENTS

| JP | 2001-092122 A | 4/2001 |
|----|---------------|--------|
| JP | 2002-64140 A | 2/2002 |
| JP | 2002-222860 A | 8/2002 |
| WO | WO 00/01752 A1 | 1/2000 |
| WO | WO 02/052642 A2 | 7/2002 |

*Primary Examiner*—Long Pham
(74) *Attorney, Agent, or Firm*—Sughrue Mion, PLLC

(57) ABSTRACT

Disclosed is a semiconductor device having a precision-worked dual damascene structure. A semiconductor substrate is obtained by forming at least a first interlayer film, an etching stopper film, a second interlayer film, a first hard mask and a second hard mask on a substrate in the order mentioned, the second hard mask being formed to have a trench pattern. At least a light absorbing sacrificial film, which has an etching rate different from that of a photoresist and is removable by use of a stripping solution, is formed on the semiconductor substrate in such a manner that the overall surface thereof will be flat. The photoresist is formed on the light absorbing sacrificial film and has an aperture pattern whose opening width is less than that of the trench pattern. At least the light absorbing sacrificial film, the first hard mask and the second interlayer film are etched selectively, one after the other, using the photoresist as an etching mask.

23 Claims, 8 Drawing Sheets

SEMICONDUCTOR DEVICE AND METHOD OF MANUFACTURING SAME

This is a divisional of application Ser. No. 10/642,279, filed Aug. 18, 2003 now U.S. Pat. No. 6,927,495, the entire disclosure of which is considered part of the disclosure of the accompanying application and is hereby incorporated by reference.

FIELD OF THE INVENTION

This invention relates to a semiconductor device in which a dual damascene interconnect structure is formed, and to a method of manufacturing the same. More specifically, the invention relates to a semiconductor device having an excellent precision-worked shape, and to a method of manufacturing the same.

BACKGROUND OF THE INVENTION

An embedded interconnect (damascene) technique is effective as a method of forming multiple-layer interconnects in a semiconductor integrated circuit device. One such technique is a dual damascene technique wherein an interconnect trench in which a top-layer interconnect is formed and a via hole (or contact hole) that connects the top-layer interconnect and a bottom-layer interconnect (or substrate) are formed in an insulating film, after which the same metal film is embedded in the interconnect trench and via hole to form the interconnect and via into a unitary body. The dual damascene technique is advantageous in that manufacturing cost can be reduced greatly owing to simplification and speed-up of the manufacturing process.

A prior-art example of a method (dual hard mask method) of forming a Cu dual damascene interconnect using a 2-layer hard mask formed on a film between interconnect layers will be illustrated below with reference to FIGS. 5A-5G.

First, a first anti-reflective film [organic BARC (Bottom Anti-Reflective Coating)] 108 is formed on a semiconductor substrate obtained by successively forming a cap film 102, a via interlayer film 103, an etching stopper film 104, an interconnect interlayer film 105, a first hard mask 106 and a second hard mask 107 on a Cu bottom-layer interconnect layer 101, and a first photoresist 109 having an aperture pattern whose opening width corresponds to the width of the interconnect is formed on the first anti-reflective film 108 [see FIG. 5A]. Next, by using the first photoresist 109 as an etching mask, the first anti-reflective film 108 and second hard mask 107 are dry-etched until the first hard mask 106 is exposed, thereby forming a desired trench pattern 121 (a trench corresponding to the interconnect width). The first photoresist 109 and first anti-reflective film 108 are then removed [see FIG. 5B]. Next, a second anti-reflective film (BARC) 113 is formed on the substrate [see FIG. 5C] and a second photoresist 111 having an aperture pattern whose opening width corresponds to the diameter of the via is formed on the second anti-reflective film 113 [see FIG. 5D]. Next, by using the second photoresist 111 as an etching mask, the second anti-reflective film 113, first hard mask 106 and interconnect interlayer film 105 are dry-etched selectively until the etching stopper film 104 is exposed, thereby forming a desired trench pattern 122 (a trench corresponding to the via diameter) [see FIG. 5E], after which the second photoresist 111 and second anti-reflective film 113 are removed [see FIG. 5F]. Next, the first hard mask 106 and etching stopper film 104 are dry-etched selectively or simultaneously using the second hard mask 107 as an etching mask, then the interconnect interlayer film 105 and via interlayer film 103 are dry-etched selectively or simultaneously until the etching stopper film 104 and cap film 102 are exposed, thereby forming an interconnect trench 123 and via hole 124 [see FIG. 5G].

Next, the exposed cap film 102 is etched by the etch-back method until the Cu bottom-layer interconnect layer 101 is exposed, then the substrate where the portion of the Cu bottom-layer interconnect layer 101 is exposed is washed. Thereafter, a Cu plating film is formed on the substrate (after a seed film and metal barrier film have been formed) until the via hole and interconnect trench are filled, after which the CU plating film and metal barrier film are flattened (not shown) by CMP (Chemical Mechanical Polishing). The result is formation of a Cu dual damascene interconnect that is electrically connected with the Cu bottom-layer interconnect layer.

SUMMARY OF THE DISCLOSURE

The conventional method relying upon dual hard masks is such that it is difficult to obtain an excellent precision-worked shape for a dual damascene interconnect structure. The reasons are as follows:

Reason 1: If the second hard mask 107 has the usual film thickness, the opening width of the second hard mask 107 widens owing to so-called drop when dry etching is performed using the second hard mask 107 as the etching mask after a trench pattern 122 (a trench corresponding to the via diameter) is formed (see FIG. 6A). The result is an interconnect having an unacceptable (unstable) shape (see FIG. 6B).

Reason 2: There are cases where the film thickness of the second hard mask 107 is made greater than usual in an effort to solve the problem set forth in Reason 1. If the second hard mask 107 is increased in thickness, however, a large step is produced. As a result, if the second anti-reflective film 113 (organic BARC) is formed to the usual film thickness, there will be a great difference between the film thickness of the second anti-reflective film 113 in the vicinity of the side wall of the trench that has been formed in the second hard mask 107 and the film thickness of the second anti-reflective film 113 remote from the side wall (see FIG. 7A). Consequently, if it is attempted to form an aperture pattern 111a, which is to be formed in the vicinity of the side wall, and an aperture pattern 111b, which is to be formed remote from the side wall, in the second photoresist 111 simultaneously, it is difficult to obtain DOF (Depth of Field) margin and, hence, pattern resolution declines (see FIG. 7B).

Reason 3: In order to solve the problem set forth in Reason 2 above, it has been contemplated to flatten the surface of the second anti-reflective film 113 by embedding the second anti-reflective film 113 in a trench that has been formed in the second hard mask 107 (see FIG. 8A). In this case, it is easier to obtain the DOF margin but a satisfactory selection ratio between the second photoresist 111 and the second anti-reflective film 113 is not achieved and the anti-reflective film takes on a thickness much greater than that mentioned in Reason 2. When etching is carried out, therefore, the opening width of the second photoresist 111 increases and the thickness of the second photoresist 111 becomes inadequate (see FIG. 8B).

Reason 4: Use of plasma stripping to remove the second anti-reflective film is essential. However, dimensions increase somewhat owing to the fact that the side wall surface of the trench formed in the interconnect interlayer film sustains damage when plasma stripping is performed.

The via hole formed by etching carried out subsequently will not have the desired via diameter.

Reason 5: If the interconnect interlayer film is an organic insulating film, a satisfactory selection ratio cannot be obtained between the second photoresist and organic insulating film at the time etching. This makes it difficult to obtain an excellent trench pattern.

Reason 6: The problems set forth in Reasons 1 to 5 become more pronounced as the wiring patterns are made more slender and it therefore becomes even more difficult to obtain an excellent precision-worked shape.

Accordingly, a first object of the present invention is to provide a semiconductor device in which a dual damascene interconnect structure with an excellent precision-worked shape is obtained, and to a method of manufacturing this device.

A second object of the present invention is to provide a semiconductor device in which the side wall surface of an interconnect interlayer film will not sustain damage, and to a method of manufacturing this device.

A third object of the present invention is to provide a semiconductor device in which an excellent precision-worked shape is obtained even if finer wiring patterns are formed, and to a method of manufacturing this device.

According to a first aspect of the present invention, the foregoing object is attained by providing a method of manufacturing a semiconductor device that forms a dual damascene interconnect structure. The method comprises the steps of: forming at least a light absorbing sacrificial film, which has an etching rate different from that of a photoresist and is capable of being removed using a stripping solution, on a semiconductor substrate so as to embed the film in a trench pattern in such a manner that the overall surface of the film will be flat, wherein the semiconductor substrate has been obtained by forming at least a first interlayer film, an etching stopper film, a second interlayer film, a first hard mask and a second hard mask on a substrate in the order mentioned, the second hard mask being formed to have the trench pattern, which exposes the first hard mask. The method further comprises: forming the photoresist on the light absorbing sacrificial film, the photoresist having an aperture pattern, which is disposed over the area of the trench pattern, having an opening width less than that of the trench pattern; and selectively etching, one after the other, at least the light absorbing sacrificial film, the first hard mask and the second interlayer film using the photoresist as an etching mask. In accordance with this structure, the surface of the light absorbing sacrificial film that is exposed from the opening in the photoresist is flattened and a satisfactory selection ratio is obtained between the photoresist and the light absorbing sacrificial film. As a result, the opening width of the opening in the photoresist is stabilized at the time of etching and a dual damascene interconnect structure having an excellent precision-worked shape is obtained.

According to a second aspect of the present invention, the foregoing object is attained by providing a method of manufacturing a semiconductor device that forms a dual damascene interconnect structure. The method comprises the steps of: forming at least a sacrificial film, which has an etching rate different from that of a photoresist and is capable of being removed using a stripping solution, on a semiconductor substrate so as to embed the film in a trench pattern in such a manner that the overall surface of the film will be flat, wherein the semiconductor substrate has been obtained by forming at least a first interlayer film, an etching stopper film, a second interlayer film, a first hard mask and a second hard mask on a substrate in the order mentioned, the second hard mask being formed to have the trench pattern, which exposes the first hard mask; forming an anti-reflective film on the sacrificial film. The method further comprises: forming the photoresist on the anti-reflective film, the photoresist having an aperture pattern, which is disposed over the area of the trench pattern, having an opening width less than that of the trench pattern; and selectively etching, one after the other, at least the anti-reflective film, the sacrificial film, the first hard mask and the second interlayer film using the photoresist as an etching mask. In accordance with this structure, the surface of the anti-reflective film that is exposed from the opening in the photoresist is flattened and the anti-reflective film can be reduced to a constant thickness. As a result, retraction of the opening in the photoresist is suppressed at the time of etching and dual damascene interconnect structure having an excellent precision-worked shape is obtained.

According to a third aspect of the present invention, the foregoing object is attained by providing a method of manufacturing a semiconductor device that forms a dual damascene interconnect structure. The method comprises the steps of: forming at least a light absorbing sacrificial film, which has an etching rate different from that of a photoresist and is capable of being removed using a stripping solution, on a semiconductor substrate so as to embed the film in a trench pattern in such a manner that the overall surface of the film will be flat, wherein the semiconductor substrate has been obtained by forming at least a cap film, a first interlayer film, an etching stopper film, a second interlayer film and a hard mask on a substrate in the order mentioned, the hard mask and the second interlayer film being formed to have the trench pattern, which exposes the etching stopper film. The method further comprises: forming the photoresist on the light absorbing sacrificial film, the photoresist having an aperture pattern, which is disposed over the area of the trench pattern, having an opening width less than that of the trench pattern; and selectively etching, one after the other, at least the light absorbing sacrificial film, the etching stopper film and the first interlayer film using the photoresist as an etching mask. In accordance with this structure, the surface of the light absorbing sacrificial film that is exposed from the opening in the photoresist is flattened and a satisfactory selection ratio is obtained between the photoresist and the light absorbing sacrificial film.

According to a fourth aspect of the present invention, the foregoing object is attained by providing a method of manufacturing a semiconductor device that forms a dual damascene interconnect structure. The method comprises the steps of: forming at least a sacrificial film, which has an etching rate different from that of a photoresist and is capable of being removed using a stripping solution, on a semiconductor substrate so as to embed the film in a trench pattern in such a manner that the overall surface of the film will be flat, wherein the semiconductor substrate has been obtained by forming at least a cap film, a first interlayer film, an etching stopper film, a second interlayer film and a hard mask on a substrate in the order mentioned, the hard mask and the second interlayer film being formed to have the trench pattern, which exposes the etching stopper film. The method further comprises: forming an anti-reflective film on the sacrificial film; forming the photoresist on the anti-reflective film, the photoresist having an aperture pattern, which is disposed over the area of the trench pattern, having an opening width less than that of the trench pattern; and selectively etching, one after the other, at least the anti-reflective film, the sacrificial film, the etching stopper film and the first interlayer film using the photoresist as an etching mask. In accordance with this structure, the surface of the anti-reflective film that is exposed from the opening in the photoresist is flattened and the anti-reflective film can be reduced to a constant thickness. As a result, retraction of the opening in the photoresist is suppressed at the time of etching and deep trench can be formed.

It is preferred that the semiconductor device be a semiconductor device that serves as a product manufactured by an intermediate process in the method of manufacturing the semiconductor device according to the first to fourth aspects of the present invention (e.g., a semiconductor device in which a sacrificial film or light absorbing sacrificial film has been formed as a film, following by the formation of a photoresist).

PREFERRED EMBODIMENTS OF THE INVENTION

A preferred mode of practicing the present invention will now be described with reference to the drawings.

FIGS. 1A-1G are partial sectional views schematically illustrating a substrate at each step of a method of manufacturing a semiconductor device according to a preferred mode of practicing the present invention.

Figure 1A:
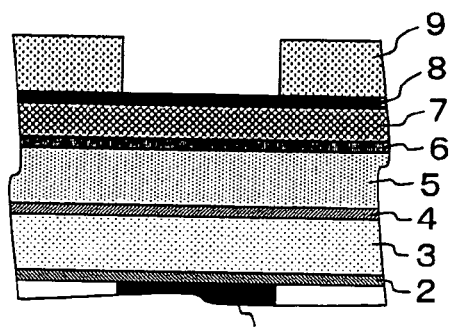
FIGS. 1A, 1B, 1C, 1D, 1E, 1F and 1G are partial sectional views schematically illustrating a substrate at each step of a method of manufacturing a semiconductor device according to a first embodiment of the present invention.
Figure 1B:
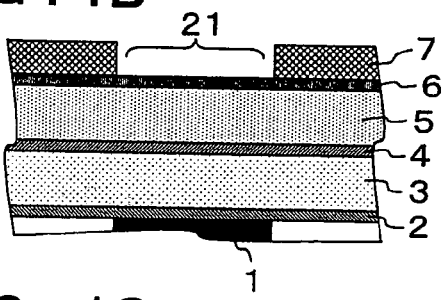
Figure 1C:
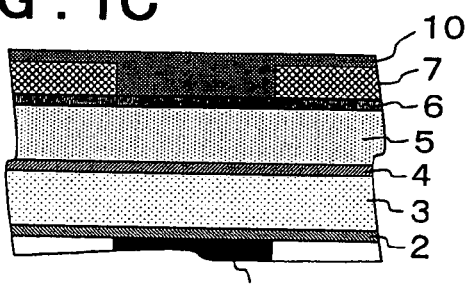
Figure 1D:
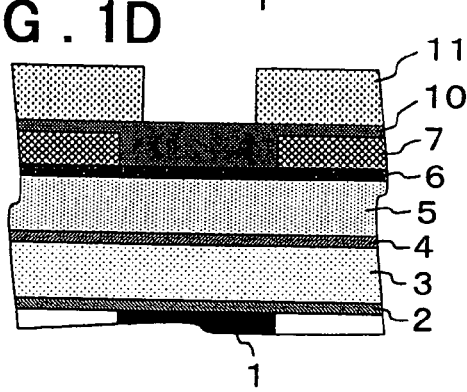
Figure 1E:
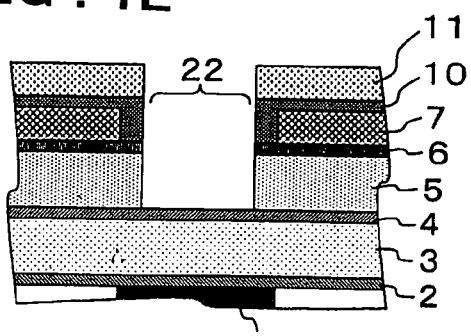
Figure 1F:
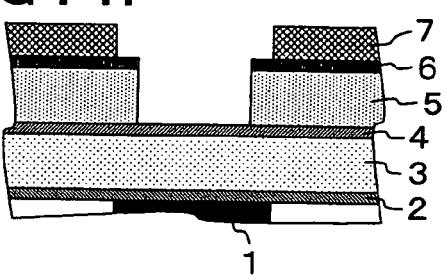

A method of manufacturing a semiconductor device that forms a dual damascene interconnect structure includes a step in FIG. 1C of forming at least a light absorbing sacrificial film 10, which has an etching rate different from that of a photoresist 11 and which is removable using a stripping solution, on a semiconductor substrate so as to embed the film in a trench pattern 21 in such a manner that the overall surface thereof will be flat, wherein the semiconductor substrate is obtained by forming at least a cap film 2, first interlayer film 3, an etching stopper film 4, a second interlayer film 5, a first hard mask 6 and a second hard mask 7 on a substrate (a substrate having a Cu bottom-layer interconnect layer 1) in the order mentioned, the second hard mask 7 being formed to have the trench pattern 21, which exposes the first hard mask 6; a step in FIG. 1D of forming the photoresist 11 on the light absorbing sacrificial film 10, the photoresist having an aperture pattern, which is disposed over the area of the trench pattern 21, having an opening width less than that of the trench pattern 21; and a step in FIG. 1E of selectively etching, one after the other, at least the light absorbing sacrificial film 10, the first hard mask 6 and the second interlayer film 5 using the photoresist 11 as an etching mask. As a result, a satisfactory selection ratio is obtained between the photoresist 11 and the light absorbing sacrificial film 10. In addition, etching can be performed in a state in which the dimensions of the opening width of the aperture pattern formed on the photoresist 11 is stabilized, and an excellent precision-worked shape can be obtained regardless of the whether the first interlayer film 3 is organic or inorganic.

The cap film 2 is a hard mask that stops etching when a via hole is formed. Examples of materials that can be used to form the cap film 2 are $SiO_2$, SiN, SiC, SiON, SiCN, etc. The cap film 2 may employ the same material as that used for the etching stopper film 4.

The first interlayer film (via interlayer film) 3 is an interlayer insulating film in which a via hole (via pattern) is formed. Examples of materials that can be used are a silicon oxide film and a low-k film, etc. Examples of materials that can be used as the low-k film are inorganic insulating films such as SiOF, SiOB, BN, SiOC and porous silica film; $SiO_2$ containing a methyl group, HSQ (hydrogensilsesquioxane), polyimide film, polytetrafluoroethylene film and other polymer films; and organic insulating films such as fluorine-doped amorphous carbon film. Preferred examples of the inorganic insulating film are a polymer whose main ingredient is siloxane having a hydrogen group or alkyl group in a side chain, or a polymer whose main ingredient is a silsesquioxane-based compound. A preferred example of the organic insulating film is a polymer whose main ingredient is an aromatic compound.

The etching stopper film 4 is a hard mask that stops etching when an interconnect trench (wiring pattern) is formed in the second interlayer film 5 and serves as an etching mask when a via hole (via pattern) is formed in the via interlayer film 3. Examples of materials that can be used are SiC, SiN, SiON and SiCN, etc. The etching stopper film 4 may employ the same material as that used for the first hard mask 6.

The second interlayer film (interconnect interlayer film) 5 is an interlayer insulating film in which the interconnect trench (wiring pattern) is formed. For example, a low-k film of the like can be used in a manner similar to that of the via interlayer film 3. Preferably, the interconnect interlayer film 5 uses a material the same as that of the via interlayer film 3 when it is etched at the same time as the via interlayer film 3.

The first hard mask 6 is a hard mask that stops etching when the trench pattern is formed in the second hard mask 7, and examples of materials that can be used are SiCN, SiC, SiN and SiON, etc. Since the first hard mask 6 exploits its etching selection ratio, the material used for the first hard mask 6 differs from that of the second hard mask 7. The first hard mask 6 may use a material identical with that of the etching stopper film 4.

The second hard mask 7 is a hard mask used as an etching mask for pattern formation (wiring pattern or via pattern) of the interconnect interlayer film, and examples of materials that can be used are SiCN, SiC, SiN and SiON, etc. Since the second hard mask 7 exploits its etching selection ratio, the material used for the second hard mask 7 differs from that of the first hard mask 6.

An anti-reflective film 8 employs, e.g., organic BARC (Bottom Anti-Reflective Coating). The anti-reflective film 8 can be formed by applying (by spin coating) an anti-reflective film-forming composition and pre-baking the coating at 200° C. for 90 seconds. Examples of the anti-reflective film-forming composition are an anti-reflective film-forming composition manufactured by Tokyo Ohka Kogyo Co., Ltd (see the specification of Japanese Patent Kokai Publication JP-P2001-92122A) or an anti-reflective film-forming composition manufactured by Clariant International Ltd. (see the specification of No. WO00/01752) containing a polymer material, a light absorbing agent (light absorbing area), an acid catalyst, an organic solvent and water. If organic BARC is used, reflection from the substrate of the coating is reduced. This makes finer exposure of the photoresist possible.

Photoresists 9 and 11 are formed by the usual method. For example, the photoresists can be formed by applying (by spin coating) a photoresist composition, pre-baking at 95° C. for 90 seconds using a hot plate to thereby form a photoresist film adjusted to a film thickness of 400 nm, subsequently exposing the substrate, on which the photoresist film (a chemically amplified positive-type photoresist) has been formed, under optimum amount of exposure and focus using an ArF excimer laser scanner (NSR-S302A manufactured by Nikon Corp.), performing post-baking at 105° C. for 90 seconds immediately following exposure, and performing development for 60 seconds in a developer consisting of a 2.38 wt % solution of aqueous tetramethylammonium hydroxide. A chemically amplified positive-type photoresist composition that includes a base resin, an acid generator, a basic compound and a solvent can be used as the photoresist composition, by way of example.

The MSQ (methylsilsesquioxane)-based light absorbing sacrificial film 10 is formed by applying (by spin coating) a composition for forming an MSQ-based light absorbing sacrificial film and pre-baking at 150 to 250° C. for 90 seconds. The composition for forming an MSQ-based light absorbing sacrificial film has MSQ as its main ingredient and contains a dye. The dye is selected from those that reduce reflection from the substrate of the coating and make possible the fine exposure of photoresist. The MSQ-based light absorbing sacrificial film 10 is selected from those that enable a satisfactory etching selection ratio to be attained relative to the photoresist 11, first hard mask 6, interconnect interlayer film 5 and etching stopper film 4. The MSQ-based light absorbing sacrificial film 10 can be removed by an organic stripping solution that contains dilute hydrofluoric acid or ammonium fluoride in very low concentration. When the MSQ-based light absorbing sacrificial film 10 is removed, $O_2$, $N_2O$ or $H_2O$ plasma ashing may be performed supplementarily.

Though this semiconductor device is obtained by forming at least the first interlayer film 3, etching stopper film 4, second interlayer film 5, first hard mask 6 and second hard mask 7 on a substrate in the order mentioned, other intervening films may also be provided and hard masks of three or more layers may be provided. Further, when etching is carried out using the photoresist 11 as the etching mask, the etching may be performed not just until the etching stopper film 4 is exposed but to a deeper level if desired.

Preferred embodiments of the present invention will now be described in detail with reference to the accompanying drawings.

FIGS. 1A-1G are partial sectional views schematically illustrating a substrate at each step of a method of manufacturing a semiconductor device according to a first embodiment of the present invention.

First, films are formed on the surface of a substrate on which has been formed the Cu bottom-layer interconnect layer 1, which is exposed at the surface. Specifically, through use of CVD (Chemical Vapor Deposition) or coating method, the cap film 2 (SiCN having a film thickness of 50 nm), the via interlayer film 3 (SiOC having a film thickness of 350 to 400 nm), the etching stopper film 4 (SiC having a film thickness of 50 nm), the interconnect interlayer film 5 (SiOC having a film thickness of 300 nm), the first hard mask 6 ($SiO_2$ having a film thickness of 500 nm) and the second hard mask 7 (SiN having a film thickness of 1500 nm) are formed on the surface of the substrate in the order mentioned [step A1; see FIG. 1A].

Next, the anti-reflective film 8 (organic BARC having a film thickness of 50 nm) is formed on the second hard mask 7, the first photoresist 9 (film thickness of 400 nm), which has an aperture pattern the opening width whereof corresponds to the width of the interconnect, is formed on the anti-reflective film 8 [see FIG. 1A], the anti-reflective film 8 and second hard mask 7 are dry-etched (plasma-etched) using the photoresist 9 as an etching mask until the first hard mask 6 is exposed, thereby forming the second hard mask 7 into the desired trench pattern 21 (a trench corresponding to the width of the interconnect). The first photoresist 9 and anti-reflective film 8 are then subjected to $O_2$ plasma ashing followed by the removal thereof using an organic stripping solution [step A2; see FIG. 1B].

Next, the MSQ light absorbing sacrificial film 10 (having a film thickness of 300 nm measured from the surface of the second hard mask 7) is formed so as to be embedded in the trench pattern 21, which has been formed in the second hard mask 7, in such a manner that the surface of the film will be flat [see FIG. 1C]. Thereafter, the second photoresist 11 (film thickness of 400 nm), which has an aperture pattern the opening width whereof corresponds to the via diameter, is formed on the surface of the MSQ light absorbing sacrificial film 10 [step A23; see FIG. 1D].

Next, the MSQ-based light absorbing sacrificial film 10, first hard mask 6 and interconnect interlayer film 5 are dry-etched selectively, one after the other, using the second photoresist 11 as the etching mask until the etching stopper film 4 is exposed, thereby forming a preliminary via pattern 22 (having a diameter of 0.2 μm with a 0.13 μm rule) [see FIG. 1E]. The second photoresist 11 and MSQ-based light absorbing sacrificial film 10 are then removed (by wet-type stripping) using an organic stripping solution (e.g., $NH_4F$) [step A4; see FIG. 1F].

The etching of this process [steps FIG. 1D to FIG. 1E] can be carried out while successively adjusting the etching gases such as $C_xF_y$, $C_xH_yF_z$, Ar, $N_2$, $O_2$, etc., in such a manner that each layer (10, 6, 5) can be etched selectively.

Figure 1G:
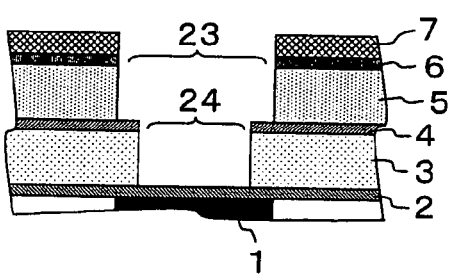

Next, the first hard mask 6 and etching stopper film 4 are dry-etched simultaneously using the second hard mask 7 as the etching mask, then the interconnect interlayer film 5 and via interlayer film 3 are dry-etched simultaneously until the etching stopper film 4 and cap film 2 are exposed, thereby forming an interconnect trench 23 and a via hole 24 (having a diameter of 0.2 µm with a 0.13 µm rule) [see FIG. 1G].

Next, the exposed cap film 2 is etched by the etch-back method until the Cu bottom-layer interconnect layer 1 is exposed, then the substrate where the portion of the Cu bottom-layer interconnect layer 1 is exposed is washed. Thereafter, a Cu plating film is formed on the substrate (after a seed film and metal barrier film have been formed) until the via hole and interconnect trench are filled, after which the Cu plating film and second hard mask 7 are flattened (until the first hard mask 6 is polished and almost eliminated) (not shown) by CMP (Chemical Mechanical Polishing). The result is formation of a dual damascene interconnect that is electrically connected with the Cu bottom-layer interconnect layer.

A second embodiment of the present invention will now be described.

The method of the second embodiment is almost the same as the method of manufacturing a semiconductor device according to the first embodiment but differs in that an organic polymer is used for the via interlayer film 3 and interconnect interlayer film 5 (see FIG. 1). The MSQ-based light absorbing sacrificial film 10 is such that a satisfactory selection ratio is obtained relative to the organic polymer as well. Even if the etching at step A4 [see FIG. 1E] in the first embodiment is carried out, therefore, the organic polymer of the interconnect interlayer film 5 can be etched while the dimensions of the MSQ-based light absorbing sacrificial film 10 are maintained in excellent fashion. This makes it possible to obtain an excellent precision-worked shape. The etching here also is carried out while successively adjusting the etching gases such as $C_xF_y$, $C_xH_yF_z$, Ar, $N_2$, $O_2$, etc., in such a manner that each layer (10, 6, 5) can be etched selectively.

A third embodiment of the present invention will now be described.

FIG. 2 is a partial sectional view schematically illustrating a substrate at each step of a method of manufacturing a semiconductor device according to a third embodiment of the present invention.

First, films are formed on the surface of a substrate on which has been formed the Cu bottom-layer interconnect layer 1, which is exposed at the surface. Specifically, through use of CVD or a coating method, the cap film 2 (SiCN having a film thickness of 50 nm), the via interlayer film 3 (SiOC having a film thickness of 350 to 400 nm), the etching stopper film 4 (SiC having a film thickness of 50 nm), the interconnect interlayer film 5 (SiOC having a film thickness of 300 nm), the first hard mask 6 ($SiO_2$ having a film thickness of 500 nm) and the second hard mask 7 (SiN having a film thickness of 1500 nm) are formed on the surface of the substrate in the order mentioned [see FIG. 1A].

Figure 2A:
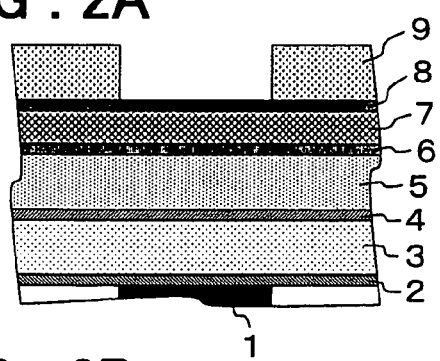
FIGS. 2A, 2B, 2C, 2D, 2E, 2F and 2G are partial sectional views schematically illustrating a substrate at each step of a method of manufacturing a semiconductor device according to a third embodiment of the present invention.

Next, the first anti-reflective film 8 (organic BARC having a film thickness of 50 nm) is formed on the second hard mask 7, the first photoresist 9 (film thickness of 400 nm), which has an aperture pattern the opening width whereof corresponds to the width of the interconnect, is formed on the first anti-reflective film 8 [see FIG. 2A], the first anti-reflective film 8 and second hard mask 7 are dry-etched (plasma-etched) using the photoresist 9 as an etching mask until the first hard mask 6 is exposed, thereby forming the second hard mask 7 into the desired trench pattern 21 (a trench corresponding to the width of the interconnect). The first photoresist 9 and first anti-reflective film 8 are then subjected to $O_2$ plasma ashing followed by the removal thereof using an organic stripping solution [see FIG. 2B].

Figure 2E:
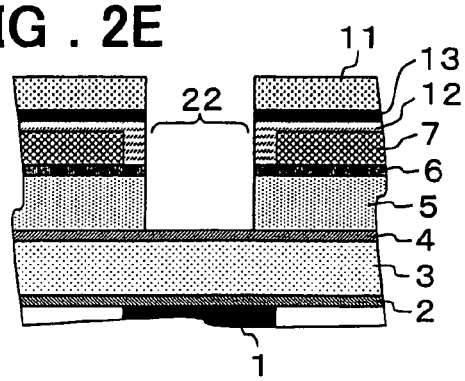
Figure 2B:
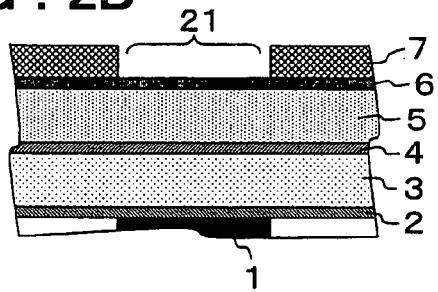
Figure 2F:
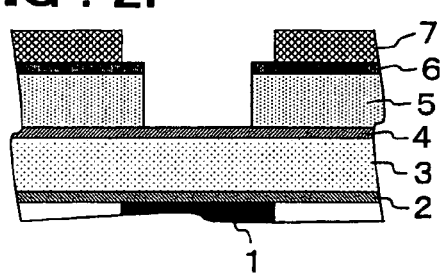
Figure 2C:
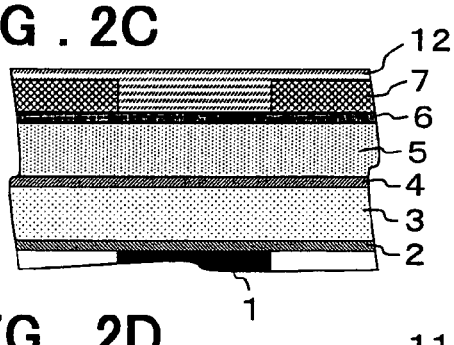

Next, a SOG (Spin on Glass) sacrificial film 12 (having a film thickness of 300 nm measured from the surface of the second hard mask 7) is formed so as to be embedded in the trench pattern 21, which has been formed in the second hard mask 7, in such a manner that the surface of the film will be flat [see FIG. 2C]. Thereafter, a second anti-reflective film 13 (organic BARC having a film thickness of 50 nm) is formed on the surface of the SOG sacrificial film 12 and the second photoresist 11 (film thickness of 400 nm), which has an aperture pattern the opening width whereof corresponds to the via diameter, is formed on the anti-reflective film 13 [see FIG. 2D].

The SOG sacrificial film 12 is formed by the spin coating of a composition obtained by dissolving an organic silicon-type polymer (e.g., a polymer whose main ingredient is siloxane having a hydrogen group or alkyl group in a side chain, or a polymer whose main ingredient is a silsesquioxane-based compound) in an organic solvent (alcohol, etc.), after which the coating is pre-baked at 100 to 200° C. for 60 seconds. The SOG sacrificial film 12 exhibits a satisfactory selection ratio with respect to the photoresist. The SOG sacrificial film 12 can be removed by an organic stripping solution that contains dilute hydrofluoric acid or ammonium fluoride in very low concentration.

Next, the second anti-reflective film 13, SOG sacrificial film 12, first hard mask 6 and interconnect interlayer film 5 are dry-etched selectively, one after the other, using the second photoresist 11 as the etching mask until the etching stopper film 4 is exposed, thereby forming the preliminary via pattern 22 (having a diameter of 0.2 µm with a 0.13 µm rule) [see FIG. 2E]. The second photoresist 11, first anti-reflective film 13 and SOG sacrificial film 12 are then removed using an organic stripping solution [see FIG. 2F].

Figure 2G:
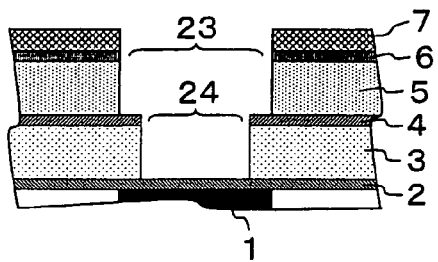
Figure 2D:
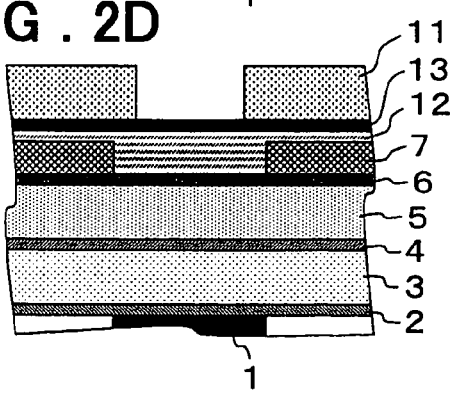

The etching of this process [steps FIG. 2D to FIG. 2E] can be carried out while successively adjusting the etching gases such as $C_xF_y$, $C_xH_yF_z$, Ar, $N_2$, $O_2$, etc., in such a manner that each layer (12, 6, 5) can be etched selectively.

Next, the first hard mask 6 and etching stopper film 4 are dry-etched simultaneously using the second hard mask 7 as the etching mask, then the interconnect interlayer film 5 and via interlayer film 3 are dry-etched simultaneously until the etching stopper film 4 and cap film 2 are exposed, thereby forming an interconnect trench 23 and the via hole 24 (having a diameter of 0.2 µm with a 0.13 µm rule) [see FIG. 2G].

Next, the exposed cap film 2 is etched by the etch-back method until the Cu bottom-layer interconnect layer 1 is exposed, then the substrate where the portion of the Cu bottom-layer interconnect layer 1 is exposed is washed. Thereafter, a Cu plating film is formed on the substrate (after a seed film and metal barrier film have been formed) until the via hole and interconnect trench are filled, after which the Cu plating film and second hard mask 7 are flattened (until the first hard mask 6 is polished and almost eliminated) by CMP. The result is formation of a dual damascene interconnect that is electrically connected with the Cu bottom-layer interconnect layer.

A fourth embodiment of the present invention will now be described.

FIG. 3 is a partial sectional view schematically illustrating a substrate at each step of a method of manufacturing a semiconductor device according to a fourth embodiment of the present invention.

First, films are formed on the surface of a substrate on which has been formed the Cu bottom-layer interconnect layer 1, which is exposed at the surface. Specifically, through use of CVD or a coating method, the cap film 2

Figure 3A:
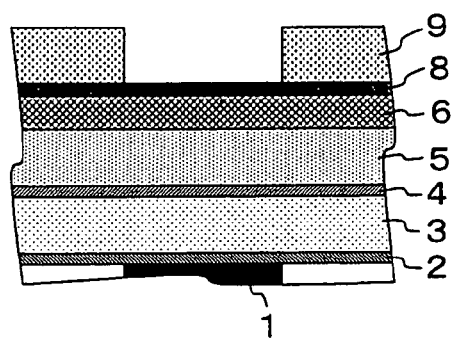
FIGS. 3A, 3B, 3C, 3D, 3E, 3F and 3G are partial sectional views schematically illustrating a substrate at each step of a method of manufacturing a semiconductor device according to a fourth embodiment of the present invention.
Figure 3E:
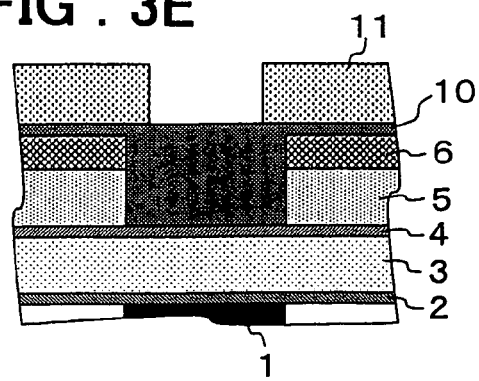

(SiCN having a film thickness of 50 nm), the via interlayer film 3 (SiOC having a film thickness of 350 to 400 nm), the etching stopper film 4 (SiC having a film thickness of 50 nm), the interconnect interlayer film 5 (SiOC having a film thickness of 300 nm) and the first hard mask 6 (SiO$_2$ having a film thickness of 500 nm) are formed on the surface of the substrate in the order mentioned [see FIG. 3A].

Figure 3B:
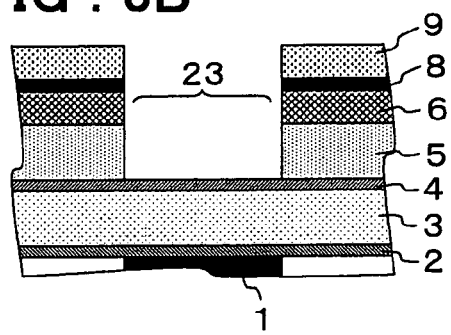

Next, the first anti-reflective film 8 (organic BARC having a film thickness of 50 nm) is formed on the hard mask 6, the first photoresist 9 (film thickness of 400 nm), which has an aperture pattern the opening width whereof corresponds to the width of the interconnect, is formed on the first anti-reflective film 8 [see FIG. 3A], the first anti-reflective film 8, hard mask 6 and interconnect interlayer film 5 are dry-etched selectively one after another using the first photoresist 9 as an etching mask until the etching stopper film 4 is exposed, thereby forming the interconnect trench 23 [see FIG. 3B]. The first photoresist 9 and first anti-reflective film 8 are subsequently removed using an organic stripping solution [see FIG. 3C].

Figure 3F:
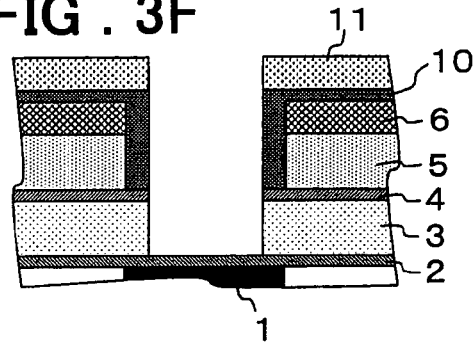
Figure 3C:
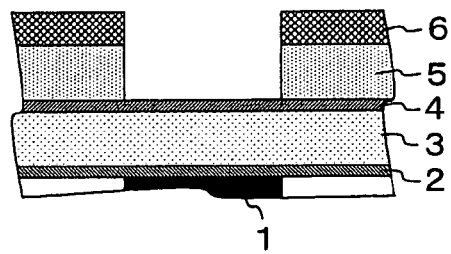
Figure 3G:
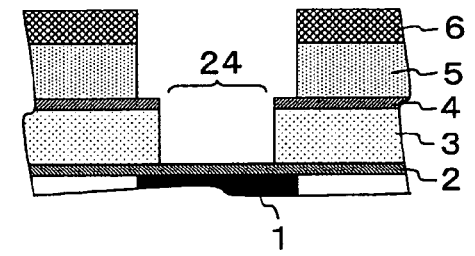
Figure 3D:
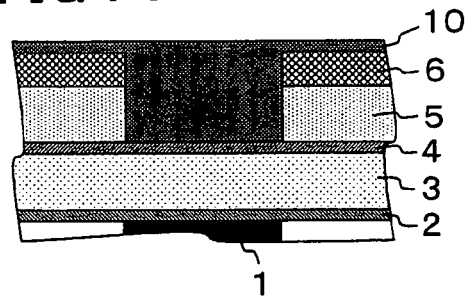

Next, the MSQ-based light absorbing sacrificial film 10 (having a film thickness of 500 nm measured from the surface of the hard mask 6) is formed so as to be embedded in the trench pattern 23 in such a manner that the surface of the film will be flat [see FIG. 3D]. Thereafter, the second photoresist 11 (film thickness of 400 nm), which has an aperture pattern the opening width whereof corresponds to the via diameter, is formed on the surface of the MSQ-based light absorbing sacrificial film 10 [see FIG. 3E].

Next, the light absorbing sacrificial film 10, etching stopper film 4 and via interlayer film 3 are dry-etched selectively, one after the other, using the second photoresist 11 as the etching mask until the cap film 2 is exposed, thereby forming the via hole 24 (having a diameter of 0.2 μm with a 0.13 μm rule) [see FIG. 3F]. The second photoresist 11 and MSQ-based light absorbing sacrificial film 10 are then removed using an organic stripping solution (e.g., NH$_4$F) [see FIG. 3G].

The etching of this process [steps (E) to (F) in FIG. 3] can be carried out while successively adjusting the etching gases such as C$_x$F$_y$, C$_x$H$_y$F$_z$, Ar, N$_2$, O$_2$, etc., in such a manner that each layer (10, 4, 3) can be etched selectively.

Next, the cap film 2 is etched by the etch-back method until the Cu bottom-layer interconnect layer 1 is exposed, then the substrate where the portion of the Cu bottom-layer interconnect layer 1 is exposed is washed. Thereafter, a Cu plating film is formed on the substrate (after a seed film and metal barrier film have been formed) until the via hole and interconnect trench are filled, after which the Cu plating film is flattened (until the hard mask 6 is polished and almost eliminated) by CMP. The result is formation of a dual damascene interconnect that is electrically connected with the Cu bottom-layer interconnect layer.

A fifth embodiment of the present invention will now be described.

FIGS. 4A-4g are partial sectional views schematically illustrating a substrate at each step of a method of manufacturing a semiconductor device according to a fifth embodiment of the present invention.

First, films are formed on the surface of a substrate on which has been formed the Cu bottom-layer interconnect layer 1, which is exposed at the surface. Specifically, through use of CVD or a coating method, the cap film 2 (SiCN having a film thickness of 50 nm), the via interlayer film 3 (SiOC having a film thickness of 350 to 400 nm), the etching stopper film 4 (SiC having a film thickness of 50 nm), the interconnect interlayer film 5 (SiOC having a film thickness of 300 nm) and the first hard mask 6 (SiO$_2$ having a film thickness of 500 nm) are formed on the surface of the substrate in the order mentioned [see FIG. 4A].

Figure 4A:
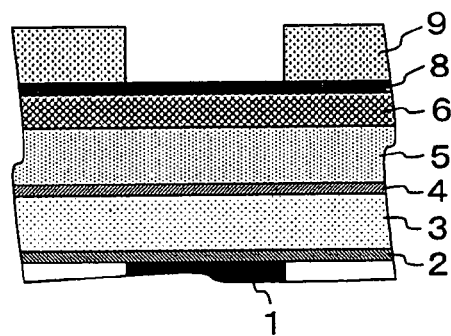
FIGS. 4A, 4B, 4C, 4D, 4E, 4F and 4G are partial sectional views schematically illustrating a substrate at each step of a method of manufacturing a semiconductor device according to a fifth embodiment of the present invention.
Figure 4B:
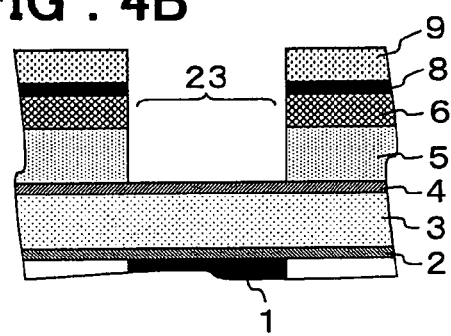
Figure 4C:
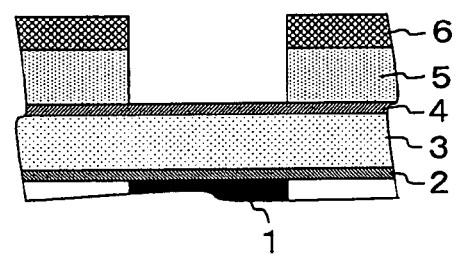

Next, the first anti-reflective film 8 (organic BARC having a film thickness of 50 nm) is formed on the hard mask 6, the first photoresist 9 (film thickness of 400 nm), which has an aperture pattern the opening width whereof corresponds to the width of the interconnect, is formed on the first anti-reflective film 8 [see FIG. 4A], the first anti-reflective film 8, hard mask 6 and interconnect interlayer film 5 are dry-etched selectively one after another using the first photoresist 9 as an etching mask until the etching stopper film 4 is exposed, thereby forming the interconnect trench 23 [see FIG. 4B]. The first photoresist 9 and first anti-reflective film 8 are subsequently removed using an organic stripping solution [see FIG. 4C].

Figure 4D:
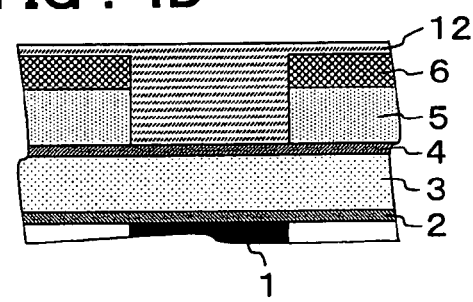

Next, the SOG sacrificial film 12 (having a film thickness of 500 nm measured from the surface of the hard mask 6) is formed so as to be embedded in the trench pattern 23 in such a manner that the surface of the film will be flat [see FIG. 4D]. Thereafter, the second anti-reflective film 13 (organic BARC having a film thickness of 500 nm) is formed on the surface of the SOG sacrificial film 12, and the second photoresist 11 (film thickness of 400 nm), which has an aperture pattern the opening width whereof corresponds to the via diameter, is formed on the anti-reflective film 13 [see FIG. 4E].

Figure 4E:
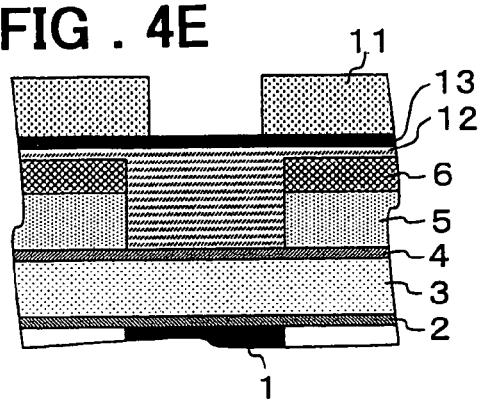
Figure 4F:
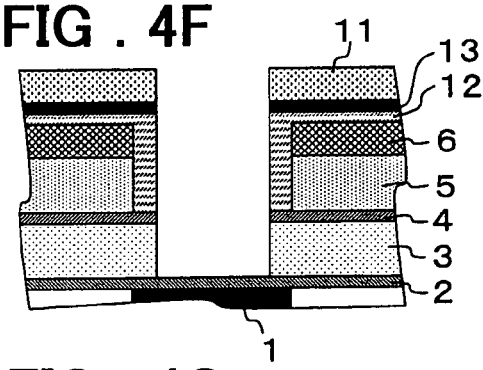
Figure 4G:
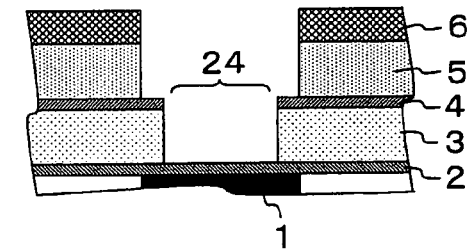
Figure 5A:
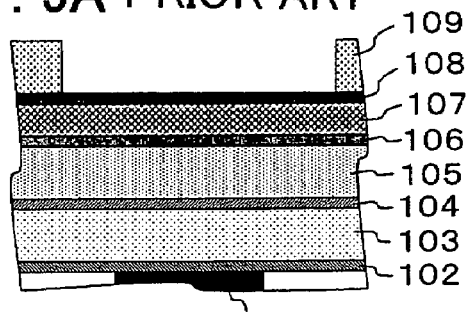
FIGS. 5A, 5B, 5C, 5D, 5E, 5F and 5G are partial sectional views schematically illustrating a substrate at each step of a method of manufacturing a semiconductor device according to an example of the prior art.
Figure 5E:
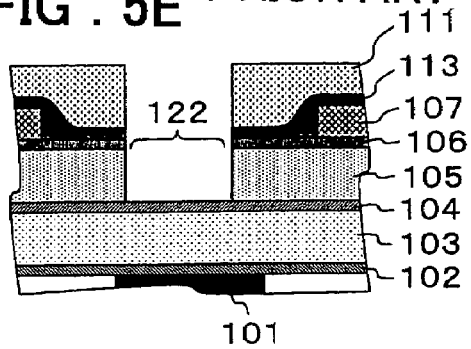
Figure 5B:
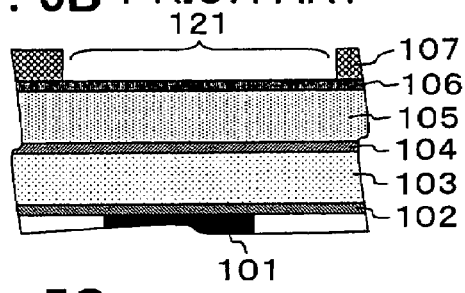
Figure 5F:
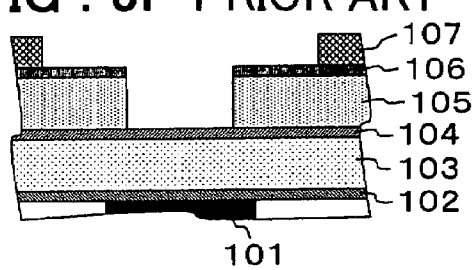
Figure 5C:
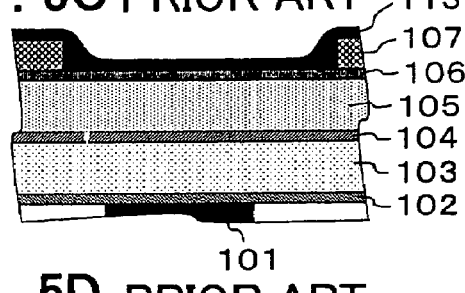
Figure 5G:
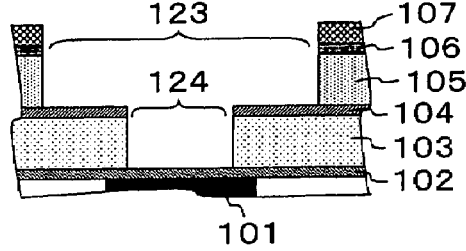
Figure 5D:
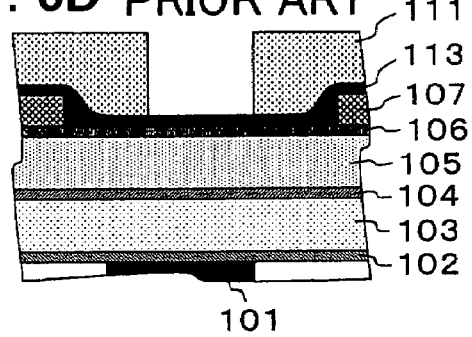
Figure 6A:
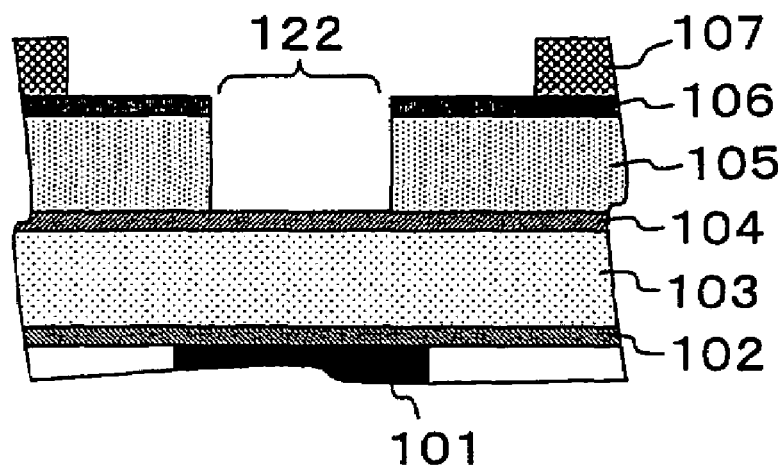
FIGS. 6A and 6B are partial sectional views schematically illustrating a substrate at each step of a method of manufacturing a semiconductor device according to first referential example.
Figure 6B:
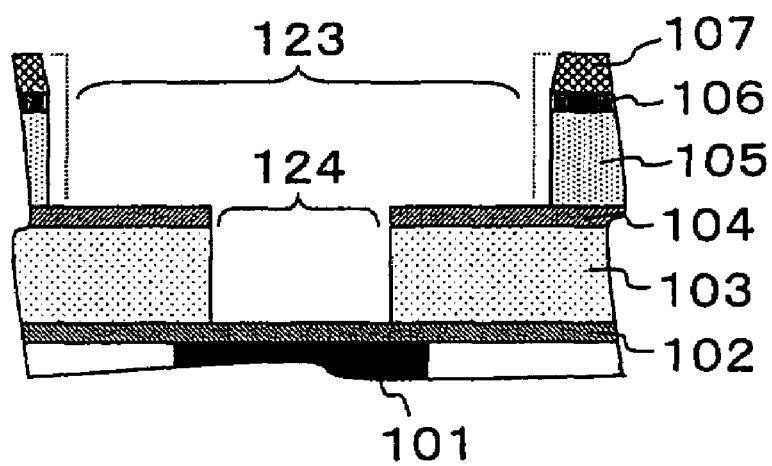
Figure 7A:
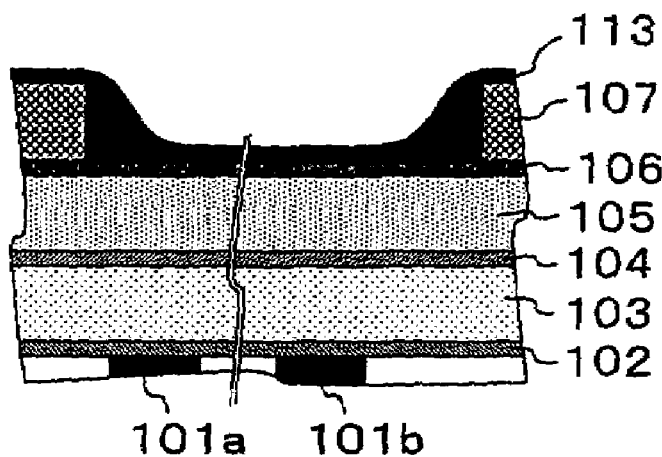
FIGS. 7A and 7B are partial sectional views schematically illustrating a substrate at each step of a method of manufacturing a semiconductor device according to second referential example.
Figure 7B:
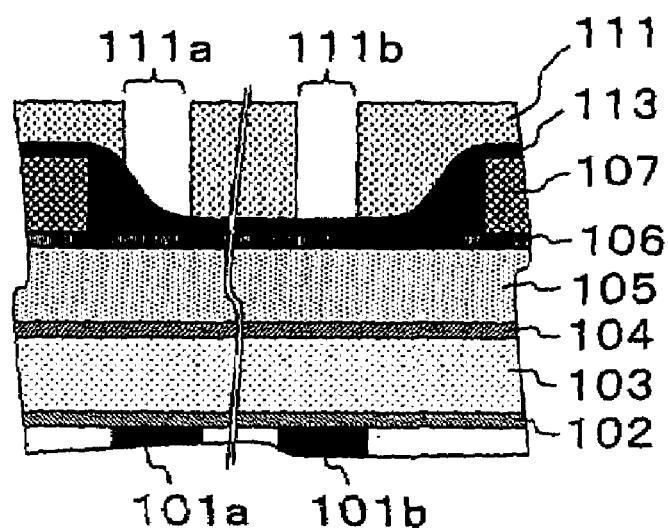
Figure 8A:
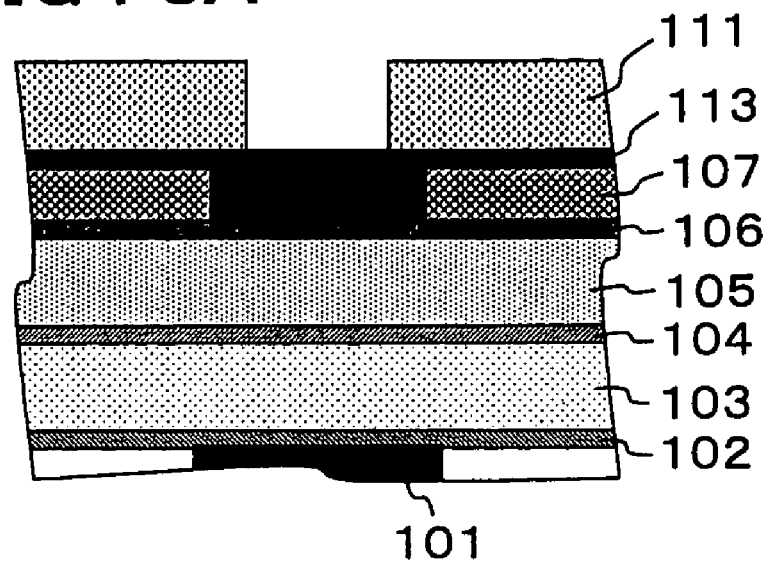
FIGS. 8A and 8B are partial sectional view schematically illustrating a substrate at each step of a method of manufacturing a semiconductor device according to third referential example.
Figure 8B:
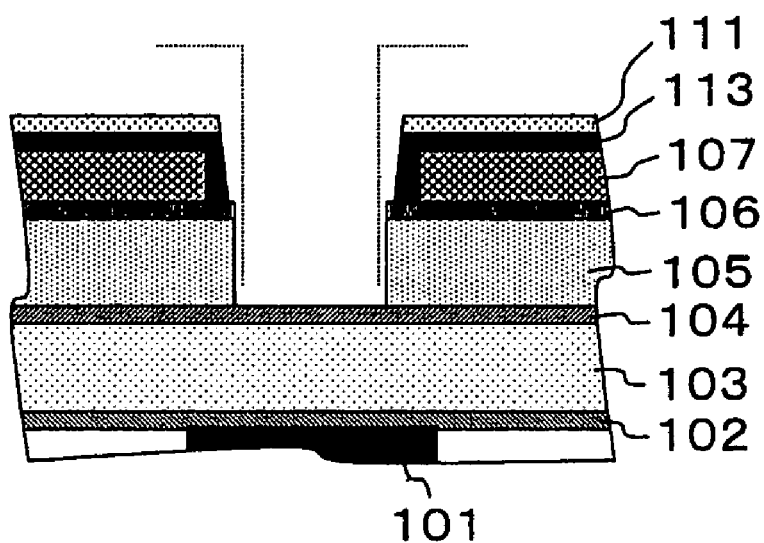

Next, the second anti-reflective film 13, SOG sacrificial film 12, etching stopper film 4 and via interlayer film 3 are dry-etched selectively, one after the other, using the second photoresist 11 as the etching mask until the cap film 2 is exposed, thereby forming the via hole 24 (having a diameter of 0.2 μm with a 0.13 μm rule) [see FIG. 4F]. The second photoresist 11, second anti-reflective film 13 and SOG sacrificial film 12 are then removed using an organic stripping solution [see FIG. 4G].

The etching of this process [steps FIG. 4E to FIG. 4F] can be carried out while successively adjusting the etching gases such as C$_x$F$_y$, C$_x$H$_y$F$_z$, Ar, N$_2$, O$_2$, etc., in such a manner that each layer (10, 4, 3) can be etched selectively.

Next, the exposed cap film 2 is etched by the etch-back method until the Cu bottom-layer interconnect layer 1 is exposed, then the substrate where the portion of the Cu bottom-layer interconnect layer 1 is exposed is washed. Thereafter, a Cu plating film is formed on the substrate (after a seed film and metal barrier film have been formed) until the via hole and interconnect trench are filled, after which the Cu plating film is flattened (until the hard mask 6 is polished and almost eliminated) by CMP. The result is formation of a dual damascene interconnect that is electrically connected with the Cu bottom-layer interconnect layer.

The meritorious effects of the present invention are summarized as follows.

In accordance with the present invention, a dual damascene interconnect structure with an excellent precision-worked shape can be obtained.

Further, in accordance with the present invention, an excellent precision-worked shape can be obtained even in a case where a via hole is formed in the vicinity of the side wall of an interconnect trench.

Further, in accordance with the present invention, an interconnect interlayer film and a via interlayer film can be precision worked regardless of whether they are organic or inorganic films.

Further, in accordance with the present invention, an excellent precision-worked shape is obtained even if wiring patterns are formed extremely finely.

Further, in accordance with the present invention, a dual damascene interconnect can be worked without damaging the interconnect interlayer film in a case where an MSQ-based light absorbing sacrificial film is used. The reason for this is that is that since an MSQ-based light absorbing sacrificial film can be removed easily as by an organic stripping solution containing dilute hydrofluoric acid or ammonium fluoride in very low concentration, removal can be performed selectively with respect to the interconnect interlayer film after the via pattern is etched, as a result of which the interconnect interlay film will not be not damaged.

Furthermore, in accordance with the invention, a satisfactory selection ratio with respect to a photoresist is obtained in a case where an MSQ-based light absorbing sacrificial film is used. As a result, it is possible to embed the film in a deep trench that has been formed in a thick hard mask and the photoresist can be formed to a high dimensional precision.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A method of manufacturing a semiconductor device, comprising the steps of:
   forming at least a light absorbing sacrificial film, which has an etching rate different from that of a photoresist and is removable by use of a stripping solution, on a semiconductor substrate so as to embed said film in a trench pattern in such a manner that the overall surface of said film will be flat, wherein the semiconductor substrate has been obtained by forming at least a first interlayer film, an etching stopper film, a second interlayer film, a first hard mask and a second hard mask on a substrate in the order mentioned, the second hard mask being formed to have the trench pattern, which exposes the first hard mask;
   forming the photoresist on the light absorbing sacrificial film, said photoresist having an aperture pattern, which is disposed over the area of the trench pattern, having an opening width less than that of said trench pattern; and
   selectively etching, one after the other, at least the light absorbing sacrificial film, the first hard mask and the second interlayer film using the photoresist as an etching mask.

2. A method of manufacturing a semiconductor device, comprising the steps of:
   forming at least a sacrificial film, which has an etching rate different from that of a photoresist and is removable by use of a stripping solution, on a semiconductor substrate so as to embed said film in a trench pattern in such a manner that the overall surface of said film will be flat, wherein the semiconductor substrate has been obtained by forming at least a first interlayer film, an etching stopper film, a second interlayer film, a first hard mask and a second hard mask on a substrate in the order mentioned, the second hard mask being formed to have the trench pattern, which exposes the first hard mask;
   forming an anti-reflective film on the sacrificial film;
   forming the photoresist on the anti-reflective film, said photoresist having an aperture pattern, which is disposed over the area of the trench pattern, having an opening width less than that of said trench pattern; and
   selectively etching, one after the other, at least the anti-reflective film, the sacrificial film, the first hard mask and the second interlayer film using the photoresist as an etching mask.

3. A method of manufacturing a semiconductor device, comprising the steps of:
   forming at least a light absorbing sacrificial film, which has an etching rate different from that of a photoresist and is removable by use of a stripping solution, on a semiconductor substrate so as to embed said film in a trench pattern in such a manner that the overall surface of said film will be flat, wherein the semiconductor substrate has been obtained by forming at least a cap film, a first interlayer film, an etching stopper film, a second interlayer film and a hard mask on a substrate in the order mentioned, the hard mask and the second interlayer film being formed to have the trench pattern, which exposes the etching stopper film;
   forming the photoresist on the light absorbing sacrificial film, said photoresist having an aperture pattern, which is disposed over the area of the trench pattern, having an opening width less than that of said trench pattern; and
   selectively etching, one after the other, at least the light absorbing sacrificial film, the etching stopper film and the first interlayer film using the photoresist as an etching mask.

4. A method of manufacturing a semiconductor device, comprising the steps of:
   forming at least a sacrificial film, which has an etching rate different from that of a photoresist and is removable by use of a stripping solution, on a semiconductor substrate so as to embed said film in a trench pattern in such a manner that the overall surface of said film will be flat, wherein the semiconductor substrate has been obtained by forming at least a cap film, a first interlayer film, an etching stopper film, a second interlayer film and a hard mask on a substrate in the order mentioned, the hard mask and the second interlayer film being formed to have the trench pattern, which exposes the etching stopper film;
   forming an anti-reflective film on the sacrificial film;
   forming the photoresist on the anti-reflective film, said photoresist having an aperture pattern, which is disposed over the area of the trench pattern, having an opening width less than that of said trench pattern; and
   selectively etching, one after the other, at least the anti-reflective film, the sacrificial film, the etching stopper film and the first interlayer film using the photoresist as an etching mask.

5. The method according to claim 1, further comprising the step of removing the photoresist and the light absorbing sacrificial film from the semiconductor substrate using the stripping solution following the etching step.

6. The method according to claim 3, further comprising the step of removing the photoresist and the light absorbing sacrificial film from the semiconductor substrate using the stripping solution following the etching step.

7. The method according to claim 2, further comprising the step of removing the photoresist, the anti-reflective film and the sacrificial film from the semiconductor substrate using the stripping solution following the etching step.

8. The method according to claim 4, further comprising the step of removing the photoresist, the anti-reflective film and the sacrificial film from the semiconductor substrate using the stripping solution following the etching step.

9. The method according to claim 5, further comprising the step of forming an interconnect trench pattern and a via pattern using the first hard mask as an etching mask after a unit of the photoresist and light absorbing sacrificial film or a unit of the anti-reflective film and sacrificial film is removed from the semiconductor substrate.

10. The method according to claim 7, further comprising the step of forming an interconnect trench pattern and a via pattern using the first hard mask as an etching mask after a unit of the photoresist and light absorbing sacrificial film or a unit of the anti-reflective film and sacrificial film is removed from the semiconductor substrate.

11. The method according to claim 1, wherein a dye-containing MSQ-based light absorbing sacrificial film, the main ingredient of which is MSQ, is used as the light absorbing sacrificial film.

12. The method according to claim 3, wherein a dye-containing MSQ-based light absorbing sacrificial film, the main ingredient of which is MSQ, is used as the light absorbing sacrificial film.

13. The method according to claim 4, wherein a dye-containing MSQ-based light absorbing sacrificial film, the main ingredient of which is MSQ, is used as the light absorbing sacrificial film.

14. The method according to claim 9, wherein a dye-containing MSQ-based light absorbing sacrificial film, the main ingredient of which is MSQ, is used as the light absorbing sacrificial film.

15. The method according to claim 2, wherein a SOG film is used as the sacrificial film.

16. The method according to claim 4, wherein a SOG film is used as the sacrificial film.

17. The method according to claim 7, wherein a SOG film is used as the sacrificial film.

18. The method according to claim 9, wherein a SOG film is used as the sacrificial film.

19. The method according to claim 15, wherein a polymer whose main ingredient is siloxane having a hydrogen group or alkyl group in a side chain, or a polymer whose main ingredient is a silsesquioxane-based compound, is used as the SOG film.

20. The method according to claim 1, wherein an inorganic insulator or organic insulator is used as the first interlayer film, and an inorganic insulator or organic insulator is used as the second interlayer film.

21. The method according to claim 20, wherein a polymer whose main ingredient is siloxane having a hydrogen group or alkyl group in a side chain, or a polymer whose main ingredient is a silsesquioxane-based compound, is used as the SOG film.

22. The method according to claim 20, wherein a polymer having an aromatic compound as its main ingredient is used as the organic insulator.

23. The method according to claim 1, wherein the same material is used as the first interlayer film and second interlayer film.

* * * * *